(12) United States Patent
Seacrist et al.

(10) Patent No.: US 8,884,310 B2
(45) Date of Patent: Nov. 11, 2014

(54) DIRECT FORMATION OF GRAPHENE ON SEMICONDUCTOR SUBSTRATES

(71) Applicants: MEMC Electronic Materials, Inc., St. Peters, MO (US); Kansas State University Research Foundation, Manhattan, KS (US)

(72) Inventors: Michael R. Seacrist, Lake St. Louis, MO (US); Vikas Berry, Manhattan, KS (US)

(73) Assignees: SunEdison Semiconductor Limited (UEN201334164H), St. Peters, MO (US); KSU Research Foundation, Manhattan, KS (US)

( * ) Notice: Subject to any disclaimer, the term of this patent is extended or adjusted under 35 U.S.C. 154(b) by 37 days.

(21) Appl. No.: 13/652,665

(22) Filed: Oct. 16, 2012

(65) Prior Publication Data

US 2013/0099195 A1 Apr. 25, 2013

Related U.S. Application Data

(60) Provisional application No. 61/548,899, filed on Oct. 19, 2011.

(51) Int. Cl.
*H01L 31/0312* (2006.01)
*H01L 21/02* (2006.01)
*H01L 21/283* (2006.01)
*H01L 29/06* (2006.01)
*B82Y 40/00* (2011.01)

(52) U.S. Cl.
CPC ........ *H01L 21/283* (2013.01); *H01L 21/02381* (2013.01); *H01L 21/02502* (2013.01); *H01L 21/02488* (2013.01); *H01L 21/0237* (2013.01); *H01L 21/0262* (2013.01); *B82Y 40/00* (2013.01); *H01L 21/02491* (2013.01); *H01L 29/06* (2013.01); *H01L 21/02527* (2013.01)
USPC ............ 257/77; 257/643; 257/649; 257/760; 257/766; 257/E21.006; 257/E21.007; 257/E21.115; 257/E21.129; 257/E21.17; 257/E21.264; 257/E21.267; 257/E21.279; 257/E21.293

(58) Field of Classification Search
USPC ........... 257/77, 643, 649, 347, 744, 758, 766, 257/914, E21.006, E21.17, E21.007, 257/E21.115, E21.129, E21.264, E21.265, 257/E21.266, E21.267, E21.279, E21.293, 257/E21.311
See application file for complete search history.

(56) References Cited

U.S. PATENT DOCUMENTS

2012/0042922 A1* 2/2012 Kondo et al. ............... 136/200
2013/0099230 A1* 4/2013 Yamazaki et al. ........... 257/43
(Continued)

OTHER PUBLICATIONS

Su, Ching-Yuan, et al., Direct Formation of Wafer Scale Graphene Think Layers on Insulating substrates by Chemical Vapor Deposition, NANO Letters, American Chemical Society, Aug. 11, 2011, pp. 3612-3616, vol. 11.

(Continued)

*Primary Examiner* — David Nhu
(74) *Attorney, Agent, or Firm* — Armstrong Teasdale LLP

(57) ABSTRACT

The invention generally related to a method for preparing a layer of graphene directly on the surface of a semiconductor substrate. The method includes forming a carbon-containing layer on a front surface of a semiconductor substrate and depositing a metal film on the carbon layer. A thermal cycle degrades the carbon-containing layer, which forms graphene directly upon the semiconductor substrate upon cooling. In some embodiments, the carbon source is a carbon-containing gas, and the thermal cycle causes diffusion of carbon atoms into the metal film, which, upon cooling, segregate and precipitate into a layer of graphene directly on the semiconductor substrate.

13 Claims, 1 Drawing Sheet

(56) References Cited

U.S. PATENT DOCUMENTS

2013/0240830 A1* 9/2013 Seacrist et al. .................. 257/9
2014/0004656 A1* 1/2014 Sasagawa et al. ............. 438/104

OTHER PUBLICATIONS

Peng, Zhiwei, et al., Direct Growth of Bilayer Graphene on SiO2 Substrates by Carbon Diffusion though Nickel, ACS Nano, American Chemical Society, 2011, pp. 8241-8247, vol. 5, No. 10.

Geim, A.K. et al., The Rise of Graphene, nature materials, Mar. 2007, pp. 183-191, vol. 6, Nature Publishing Group.

First, Phillip N. et al., Epitaxial Graphenes on Silicon Carbide, MRS Bulletin, Apr. 2010, pp. 296-305, vol. 35, www.mrs.org/bulletin.

Bae, Sukang et al., Roll-toroll production of 30-inch graphene films for transparent electrodes, Nature Nanotechnology, 2010, pp. 1-7, Macmillan Publishers Limited, www.nature.com/naturenanotechnology.

Yan, Zheng, et al., Growth of Bilayer Graphene on Insulting Substrates, ASC NANO, Just Accepted Manuscripts, Sep. 2, 2011, pp. 20, http://pubs.acs.org.

Berry, Vikas et al., Graphene-Based Single-Bacterium Resolution Biodevice and DNA Transistor: Interfacing Graphene Derivatives with Nanoscale and Microscale Biocomponents, Nano Lett., 2008, pp. 4469-4476, vol. 8, No. 12, ACS Publications, Washington, DC.

Kim, Deun Soo, et al., Large-scale pattern growth of graphene films for stretchable transparent electrodes; Letters, nature, 2009, doi:10.1038/nature07719, pp. 1-5.

Reina, Alfonso, Large Area, Few-Layer Graphene Films on Arbitrary Substrates by Chemical Vapor Deposition, Nano Letters, 2009, vol. 9, No. 1, 30-35, ACS Publications, Washington DC.

International Search Report and Written Opinion of the International Searching Authority regarding PCT/US2012/060810 filed on Oct. 18, 2013 issued on Apr. 8, 2013, 22 pgs.

Li, et al., Synthisis, Characterization, and Properties of Large-Area Graphene Films,ECS Transactions, 2009, pp. 41-51, vol. 19, No. 5,The Electrochemical Society.

* cited by examiner

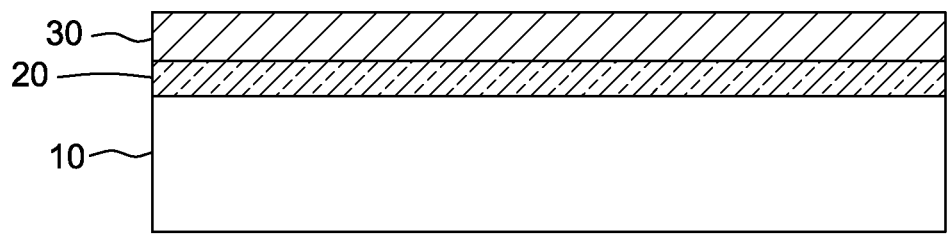

DIRECT FORMATION OF GRAPHENE ON SEMICONDUCTOR SUBSTRATES

CROSS REFERENCE TO RELATED APPLICATION

This application is a U.S. Non-Provisional application which claims the benefit of U.S. Application Ser. No. 61/548,899, filed on Oct. 19, 2011, the entire contents of which is hereby incorporated herein by reference.

FIELD OF THE INVENTION

The field of the invention relates generally to a method for producing graphene and other atomically thick sheets on a semiconductor substrate.

BACKGROUND OF THE INVENTION

Graphene is the hexagonal arrangement of carbon atoms forming a one-atom thick planar sheet. Graphene is a promising electronic material. It has the potential to significantly impact the semiconductor industry due to its superior electrical, thermal, mechanical, and optical properties while at the same time offering compatibility with existing semiconductor processing techniques. In order to realize these benefits in volume manufacturing, paths to integrating graphene on large diameter silicon substrates are necessary. Current processes require graphene to be transferred from a metal base to the desired substrate. This transfer process of an atomically-thick sheet is challenging and leads to low yield and a significant density of folds and tears.

Since the successful isolation, identification, and characterization of graphene by A. Geim and K. Novoselov in 2004, the most common method for producing flakes of graphene has been by tape exfoliation from graphite and transfer to oxidized silicon wafer. This method produces small, irregularly shaped flakes of graphene and is not suitable for scaling to large diameter integration with silicon. See A. K. Geim and K. S. Novovselov, "The Rise of Graphene" Nature Materials 6 (2007) 183-191.

Research into producing wafer level graphene and large area sheets of graphene has produced the development of two main options.

First, W. deHeer's group at Georgia Institute of Technology has demonstrated the formation of graphene layers on SiC wafer by silicon sublimation and outdiffusion at very high temperature. The disadvantage of this technique is the high cost of SiC wafers, the smaller diameter SiC wafers, and the absence of integration scale possible on silicon wafers. Some groups are working on depositing SiC on Silicon and attempting to form graphene on the deposited SiC layer. See P. First, W. deHeer et al, "Epitaxial Graphenes on Silicon Carbide" MRS Bulletin 35, 296-305 (2010).

Groups in Korea and the University of Texas system have demonstrated graphene formation on metal foils such as Cu and Ni. See S. Bae et al, "Roll-to Roll Production of 30 inch Graphene Films for Transparent Electrodes" Nature Nanotechnology 5, 574-578 (2010) and X. Li et al, ECS Transactions, "Synthesis, Characterization, and Properties of Large-Area Graphene Films" 19 (5), 41-52 (2005). Using a carbon source such as methane mixed with hydrogen at temperatures in the 700-1000° C. range in a CVD chamber at pressure such as 100 mtorr, carbon is absorbed into the metal film and the upon cooling segratates or precipitates to the surface of the metal foil forming single or multi layer graphene depending on the process conditions and the metal foil. The graphene layer then has to be transferred to oxidized silicon. The transfer process generally uses a material like PMMA on graphene followed by dissolution of the metal foil, then graphene is bonded to the silicon dioxide layer, and finally the PMMA is removed leaving graphene on $SiO_2$ on Silicon. Although the graphene formation on metal foils enables large sheets of graphene to be produced, the process for transferring large area graphene sheets to large diameter silicon substrates for electronic device fabrication is challenging. Issues such as film stress, chemical residues, bonding defects, and wrinkles in the graphene film are likely to be significant challenges for a manufacturable process.

BRIEF DESCRIPTION OF THE INVENTION

Briefly, the present invention is directed to a method of preparing a semiconductor substrate. The semiconductor substrate comprises two major, generally parallel surfaces, one of which is the front surface of the semiconductor substrate and the other of which is a back surface of the semiconductor substrate, and a circumferential edge joining the front and back semiconductor substrate surfaces. The method comprises forming a metal film on the front surface of the semiconductor substrate, the metal film comprising a front metal film surface, a back metal film surface, and a bulk metal region between the front and back metal film surfaces, wherein the back metal film surface is in contact with the front semiconductor substrate surface. The method further comprises contacting the front metal film surface with a carbon-containing gas in a reducing atmosphere at a temperature sufficient to in-diffuse carbon atoms into the bulk metal region of the metal film. The method still further comprises precipitating carbon atoms to thereby form a layer of graphene between the front semiconductor substrate surface and the back metal film surface.

In some embodiments, the carbon atoms are precipitated into a layer or multi-layer of graphene by forming a temperature gradient profile in the semiconductor substrate having the metal film thereon, the temperature gradient profile being such that temperatures at the front metal film surface and the back metal film surface are less than a temperature near a central plane within the bulk metal region.

In some embodiments, the carbon atoms are precipitated into a layer or multi-layer of graphene by rapid cooling of the semiconductor substrate having the metal film thereon.

The invention is further directed to a method of preparing a semiconductor substrate. The semiconductor substrate comprising two major, generally parallel surfaces, one of which is the front surface of the semiconductor substrate and the other of which is a back surface of the semiconductor substrate, a circumferential edge joining the front and back semiconductor substrate surfaces, and a central plane between the front and back semiconductor substrate surfaces. The method comprises depositing a layer comprising a carbon-rich polymer on the front surface layer of the semiconductor substrate. The method further comprises forming a metal film on the carbon-rich polymer layer, the metal film comprising a front metal film surface, a back metal film surface, and a bulk metal region between the front and back metal film surfaces, wherein the back metal film surface is in contact with the layer comprising the carbon-rich polymer. The method still further comprises heating the semiconductor substrate comprising the layer comprising the carbon-rich polymer and the metal film thereon to a temperature sufficient to degrade the carbon-rich polymer layer in the presence of hydrogen. The method still further comprises precipitating carbon atoms to thereby form a layer of graphene between the front semiconductor substrate surface and the back metal film surface.

In some embodiments, the carbon atoms are precipitated into a layer or multi-layer of graphene between the front semiconductor substrate surface and the back metal film surface by forming a temperature gradient profile in the semiconductor substrate having the carbon-rich polymer layer and metal film thereon, the temperature gradient profile being such that temperatures at the front metal film surface and the back metal film surface are less than a temperature near a central plane within the bulk metal region.

In some embodiments, the carbon atoms are precipitated into a layer or multi-layer of graphene between the front semiconductor substrate surface and the back metal film surface by rapidly cooling the semiconductor substrate having the carbon-rich polymer layer and metal film thereon.

The invention is still further directed to a multilayer article comprising a semiconductor substrate comprising two major, generally parallel surfaces, one of which is the front surface of the donor substrate and the other of which is a back surface of the donor substrate, a circumferential edge joining the front and back surfaces, and a central plane between the front and back surfaces; a layer of graphene in contact with the front surface of the semiconductor substrate; and a metal film in contact with the layer of graphene, the metal film comprising a front metal film surface, a back metal film surface, and a bulk metal region between the front and back metal film surfaces.

BRIEF DESCRIPTION OF THE DRAWINGS

FIG. 1 is a depiction of a structure comprising a semiconductor substrate, a graphene layer in contact with the semiconductor substrate, and a metal film in contact with the layer of graphene.

DETAILED DESCRIPTION OF THE EMBODIMENT(S) OF THE INVENTION

The present invention is directed to a method for forming graphene directly on a semiconductor substrate, e.g., a semiconductor wafer. Advantageously, the method of the present invention enables coating at least a portion of a large diameter semiconductor wafer, e.g., a silicon wafer coated with silicon dioxide, with at least a layer of graphene. In some embodiments, the method of the present invention enables coating at least a portion of a large diameter semiconductor wafer, e.g., a silicon wafer coated with silicon dioxide, with a single mono-atomic layer of graphene. Stated another way, at least a portion of the major surface of the wafer is coated with a single layer of graphene, the single layer having mono-atomic thickness. In some embodiments, the method of the present invention enables coating at least a portion of a large diameter semiconductor wafer, e.g., a silicon wafer coated with silicon dioxide, with a bi-layer of graphene, each layer of the bi-layer comprising a layer of graphene of mono-atomic thickness. In some embodiments, the method of the present invention enables coating at least a portion of a large diameter semiconductor wafer, e.g., a silicon wafer coated with silicon dioxide, with a multi-layer of graphene having three or more layers, each layer of the multi-layer comprising a layer of graphene of mono-atomic thickness. In some embodiments, the entire major surface of the wafer may be coated with a layer or a multi-layer of graphene. In some embodiments, a portion of the major surface of the wafer may be coated with a layer or a multi-layer of graphene.

In general, the method of the present invention relies on deposition of a metal film on the major surface of a semiconductor substrate and exposing the multilayer structure to a carbon source whereby carbon is absorbed into the metal film. In some embodiments, the carbon source may be a hydrocarbon-containing self assembled monolayer or a carbon-rich polymer that is deposited on a surface of the semiconductor substrate prior to deposition of the metal film. In some embodiments, the carbon source may be a combination of a hydrocarbon-containing self assembled monolayer and a carbon-rich polymer, both of which are deposited on a surface of the semiconductor substrate prior to deposition of the metal film. In some embodiments, the carbon source may be a carbon-rich gas, e.g., methane, in which carbon is absorbed into the metal film during a vapor deposition process. In some embodiments, a solid carbon source, e.g., self-assembled monolayer and/or polymer, may be placed between the semiconductor substrate and the metal film, and the method further includes carbon absorption from a carbon-containing gas.

In some embodiments, the metal deposited on the major surface of the semiconductor substrate has a high carbon solubility at the temperature of carbon deposition, e.g., nickel. In these embodiments, the carbon may be absorbed into the metal film from the solid or gaseous carbon source. When the multilayer structure is cooled, carbon segregates and precipitates from the metal film thereby depositing at least one layer of graphene between the semiconductor substrate and the metal film.

In some embodiments of the invention, the metal deposited on the major surface of the semiconductor substrate has a low or substantially zero carbon solubility at the temperature of carbon deposition. Such metals include, e.g., copper. Herein, elevated temperatures degrade the carbon source, e.g., a gaseous carbon or a carbon containing polymer, and the metal surface catalyzes the growth of at least one layer of graphene between the semiconductor substrate and the metal film.

In some embodiments, the metal layer may be deposited over the entire major surface of the semiconductor substrate. In some embodiments, the metal layer may be deposited over a portion of the substrate, such as at least about 10% of the total area of the major surface, or at least about 25% of the total area, or at least about 50% of the total area, or at least about 75% of the total area. In some embodiments, the metal layer may be deposited over the entire major surface of the semiconductor substrate and thereafter metal may be removed, using conventional lithography techniques, to thereby leave a desired pattern of metal deposition on the major surface of the substrate.

The metal film may be removed, e.g., by etching, thereby yielding a multilayer semiconductor structure comprising a semiconductor substrate and a mono-atomic layer of graphene. The graphene layer has the same dimensions as the metal layer deposited on the major surface of the semiconductor substrate. In view thereof, the method enables preparation of graphene layers having desired patterns, e.g., by lithography of the metal layer, on the major surface of the semiconductor substrate. Advantageously, the graphene is deposited without any layer transfer steps.

According to the method of the present invention, the graphene layer or layers is/are deposited on a semiconductor substrate. A semiconductor substrate may comprise two major, generally parallel surfaces, one of which is a front surface of the substrate and the other of which is a back surface of the substrate. A circumferential edge joins the front and back surfaces, and a central plane lies between the front and back surfaces. Prior to any operation as described herein, the front surface and the back surface of the substrate may be substantially identical. A surface is referred to as a "front surface" or a "back surface" merely for convenience and generally to distinguish the surface upon which the operations of method of the present invention are performed. In some embodiments of the present invention, the operations of the invention are performed on the front surface of the semiconductor substrate. In some embodiments of the present invention, the operations of the present invention are performed on both the front surface and the back surface of the semiconductor substrate.

In some embodiments, the semiconductor substrate comprises a semiconductor wafer. In preferred embodiments, the semiconductor wafer comprises a material selected from among silicon, silicon carbide, silicon germanium, silicon nitride, silicon dioxide, gallium arsenic, gallium nitride, indium phosphide, indium gallium arsenide, and germanium. The semiconductor wafer may comprise combinations of such materials, e.g., in a multilayer structure. In general, the semiconductor wafer has a diameter of at least about 20 mm, more typically between about 20 mm and about 500 mm. In some embodiments, the diameter is about 20 mm, about 45 mm, about 90 mm, about 100 mm, about 150 mm, about 200 mm, about 300 mm or even about 450 mm. The semiconductor wafer may have a thickness between about 100 micrometers and about 5000 micrometers, such as between about 100 micrometers and about 1500 micrometers.

In particularly preferred embodiments, the semiconductor wafer comprises a wafer sliced from a single crystal silicon wafer which has been sliced from a single crystal ingot grown in accordance with conventional Czochralski crystal growing methods. Such methods, as well as standard silicon slicing, lapping, etching, and polishing techniques are disclosed, for example, in F. Shimura, Semiconductor Silicon Crystal Technology, Academic Press, 1989, and Silicon Chemical Etching, (J. Grabmaier ed.) Springer-Verlag, N.Y., 1982 (incorporated herein by reference). In some preferred embodiments, the semiconductor silicon substrate is a polished silicon wafer grown by the CZ method. The silicon substrate may have any crystal orientation, e.g., (100), (110), and (111).

In some embodiments of the method of the present invention, one or more of the major surfaces of the semiconductor substrate may be modified with a dielectric layer. In some preferred embodiments, the semiconductor substrate comprises a silicon wafer, the front surface layer of which is oxidized prior to ion implantation. In preferred embodiments, the front surface layer, i.e., the layer upon which the metal film is deposited, is oxidized. In preferred embodiments wherein the semiconductor substrate comprises a silicon wafer, the front surface of the silicon wafer is preferably oxidized such that the front surface layer of the silicon wafer comprises a silicon dioxide (SiO$_2$) layer having a thickness between about 30 nm and about 1000 nm, between about 50 nm and about 500 nm, preferably between about 50 nm and about 300 nm, such as between about 90 nm and about 300 nanometers thick, or between about 90 nm and about 200 nanometers thick. The front surface of the silicon wafer may be thermally oxidized via wet or dry oxidation, as is known in the art. Oxidation generally occurs at temperatures between about 800° C. and about 1200° C. using water vapor and/or oxygen.

In some embodiments of the method of the present invention, a self-assembled monolayer comprising a hydrocarbon-containing silane and/or a hydrocarbon-containing silicate (i.e., organosilane, organosilicates) may be deposited on the silicon oxide layer prior to forming the metal film. Herein, the hydrocarbon-containing moiety acts as a source of carbon, which will in-diffuse into the subsequently applied metal film during a heating cycle or degrade into graphene wherein the metal film comprises a metal having low or substantially zero carbon solubility. The hydrocarbon-containing silane and/or a hydrocarbon-containing silicate provide a carbon source for graphene formation on the front surface layer of the semiconductor substrate. In general, the silane or silicate for forming the self-assembled monolayer has the structure:

$$SiX_3-(CH_2)_n-CH_3$$

wherein:

each X is independently a halide atom, an alkyl group, or an alkoxy group; and n is an integer between one and 25, preferably between about 3 and about 15.

The alkyl group may comprise from 1 to 4 carbon atoms, such as methyl, ethyl, n-propyl, isopropyl, n-butyl, isobutyl, or tert-butyl. In embodiments wherein X is alkyl, preferably, each X is methyl.

The alkoxy group may comprise from 1 to 4 carbon atoms, such as methoxy, ethoxy, n-propoxy, isopropoxy, n-butoxy, isobutoxy, or tert-butoxy. In embodiments wherein X is alkoxy, preferably, each X is methoxy or each X is ethoxy.

The halide atom may be, e.g., chloride or bromide.

In order to deposit the silane or silicate so that it forms a self-assembled monolayer on the semiconductor substrate surface, the semiconductor, e.g., silica, surface is first cleaned in oxygen plasma (suitable conditions include 100 W, 600 mTorr, 2 min) The oxygen plasma also introduces hydroxyl groups on silica surface. The substrate is then treated with the silane or silicate generally by immersion in a solution containing the silane or silicate. A suitable composition may be 1 wt.% in ethanol. The substrate may be immersed in this solution for 10 minutes. After deposition, the substrate is washed, for example, 3 times with 99% ethanol, followed by baking. Suitable baking conditions are 120° C. for 4 minutes.

Other suitable hydrocarbon-containing materials that may be used to form self-assembled monolayers include hexamethyldisilazane and aluminum alkyls. Aluminum alkyls are less preferred since the aluminum may dope the graphene product.

In some embodiments of the method of the present invention, a carbon-rich polymer is deposited on the semiconductor substrate, e.g., a semiconductor wafer having a dielectric layer thereon, prior to forming the metal film. In some embodiments, the carbon-rich polymer is deposited on a metal layer that has been deposited on the major surface of the semiconductor wafer. In some embodiments of the method of the present invention, a carbon-rich polymer is deposited on the semiconductor substrate, e.g., a semiconductor wafer having a dielectric layer thereon, prior to forming the metal film, and a second carbon-rich polymer layer is deposited on the surface of the metal film. Herein, the carbon-rich polymer acts as the source of carbon, which will in-diffuse into the subsequently applied metal film during a heating cycle or degrade into graphene wherein the metal film comprises a metal having low or substantially zero carbon solubility. In general, a wide variety of carbon-containing polymers are suitable. In some embodiments, the carbon-rich polymer may be selected from the group consisting of polymethylmethacrylate (PMMA), polybutadiene, polystyrene, poly(acrylonitrile-co-butadiene-co-styrene) (ABS), polyethylene, polypropylene, poly(4'-vinylhexaphenylbenzene)s, and combinations thereof.

In some embodiments, the polymer or carbon-containing film may contain nitrogen or boron in order to produce nitrogen-doped or boron-doped graphene sheets. Nitrogen-containing polymers suitable for the present invention include melamine formaldehyde, polyacrylonitrile, poly(2,5 pyridine), polypyrrole, polycarbazole, polyaniline, and combinations thereof. Boron doping may be achieved by preparing a carbon-containing layer comprising boron alcohols (non-polymeric) or by depositing Boramer™.

The carbon-rich polymer may be deposited by spin coating the substrate with a polymer film from a polymer-containing solution. Other suitable deposition methods include spray coating and electrochemical deposition. Suitable solvents for the spin-coating solution include toluene, hexane, xylene, pentane, cyclohexane, benzene, chloroform. The polymer concentration is generally between about 0.01 wt. % and about 1 wt. %, between about 0.05 wt. % and about 0.5 wt. %, such as about 0.1 wt. %.

The carbon-rich polymer layer may be deposited to a thickness between about 1 nanometer and about 100 nanometers thick, such as between about 5 nanometer and about 100 nanometers thick, preferably between about 10 nanometers and about 50 nanometers thick. In some embodiments, the carbon-rich polymer layer may be deposited to a thickness between about 1 nanometer and about 10 nanometers.

According to the method of the present invention, the major surface of the semiconductor substrate is coated with a metal film. In some embodiments, the metal layer may be deposited over the entire major surface of the semiconductor substrate. In some embodiments, the metal layer may be deposited over a portion of the substrate, such as at least about 10% of the total area of the major surface, or at least about 25% of the total area, or at least about 50% of the total area, or at least about 75% of the total area. In some embodiments, the metal layer may be deposited over the entire major surface of the semiconductor substrate and thereafter metal may be removed selectively, using conventional lithography techniques, to thereby leave a desired pattern of metal deposition on the major surface of the substrate. In some embodiments, the front surface layer of the semiconductor substrate is coated with a metal film. The front surface layer may be completely coated with metal, partially coated with metal, or coated with a metal pattern by lithography. In some embodiments, the semiconductor substrate comprises a semiconductor wafer having a dielectric layer thereon. In some preferred embodiments, the semiconductor substrate comprises a silicon wafer having a silicon dioxide front surface layer, and the metal film is deposited onto the silicon dioxide front surface layer. The silicon dioxide layer may be completely coated with metal, partially coated with metal, or coated with a metal pattern by lithography. In some preferred embodiments, the semiconductor substrate comprises a silicon wafer having a silicon dioxide front surface layer, which is further modified with a hydrocarbon-containing self-assembled monolayer, e.g., a hydrocarbon-containing silane self-assembled monolayer, or a carbon-rich polymer, and the metal film is deposited onto the self-assembled monolayer or the carbon-rich polymer. Herein, a multilayer structure is prepared comprising a semiconductor substrate, a dielectric layer, a carbon-containing layer comprising a hydrocarbon-containing silane self-assembled monolayer or a carbon-rich polymer, and a metal film. For the sake of convenience, the surfaces of the metal film may be referred to as a "front metal film surface" and "a back metal film surface." Herein, the back metal film surface is in contact with the front semiconductor substrate surface layer, which may comprise a dielectric layer and optionally a hydrocarbon-containing silane self-assembled monolayer or a carbon-rich polymer. A bulk metal region is between the front and back metal film surfaces.

Metals suitable for the present invention include nickel, copper, iron, platinum, palladium, ruthenium, cobalt, and alloys thereof. In preferred embodiments, the metal film comprises nickel. The metal film may be deposited by techniques known in the art, including sputtering, evaporation, electrolytic plating, and metal foil bonding. In some embodiments, the metal film is deposited by sputtering or evaporation using, e.g., a Sputtering and Metal evaporation Unit. Electrolytic metal plating may occur according to the methods described by Supriya, L.; Claus, R. O. Solution-Based Assembly of Conductive Gold Film on Flexible Polymer Substrates: Langmuir 2004, 20, 8870-8876. Preferably, the metal film is between about 50 nanometers and about 20 micrometers thick, such as between about 50 nanometers and about 10 micrometers thick, such as between about 50 nanometers and about 1000 nanometers, such as about 300 nanometers.

In some embodiments, the metal film may comprise metal that has relatively high solubility for carbon at elevated temperatures (i.e., generally greater than 500° C., or greater than 800° C., such as about 1000° C.), which enables in-diffusion of carbon. Preferably, the metal also has low or substantially zero carbon solubility at cooler temperatures to thereby enable carbon segregation and precipitation into graphene in a subsequent cooling step. High carbon solubility metal films at the temperature of carbon in-diffusion include nickel, iron, palladium, and cobalt. In some embodiments, the metal film comprises metal having carbon solubility of at least about 0.05 atomic % at 1000° C., preferably at least about 0.10 atomic % at 1000° C., ever more preferably at least about 0.15 atomic % at 1000° C. In some embodiments, the metal film comprises metal having carbon solubility less than about 3 atomic % at 1000° C., preferably less than about 2 atomic % at 1000° C. For example, in some preferred embodiments, the metal film comprises nickel, which has a carbon solubility of about 0.2 atomic % at 1000° C., which is the chamber temperature for carbon in-diffusion when nickel is the metal film. In some embodiments, the metal film comprises iron, which has a carbon solubility of about 0.02 atomic % at 800° C., which is the chamber temperature for carbon in-diffusion when iron is the metal film.

In some embodiments, the metal film may comprise metal that has low or substantially zero carbon solubility even at elevated temperatures (i.e., generally greater than 500° C., or greater than 800° C., such as about 1000° C.). Low carbon solubility metal films include copper, platinum, ruthenium, and cobalt. For example, carbon solubility is virtually zero in copper at temperatures greater than 500° C., or greater than 800° C., such as about 1000° C. When copper is selected as the metal for the metal film, the carbon containing gas or the carbon containing polymer is degraded by hydrogen on copper. Carbon-carbon bond formation into graphene is catalyzed by on the copper surface.

After deposition of the metal film, the multilayer structure may be cleaned. The multilayer structure comprises the semiconductor substrate, optional surface dielectric layer, a polymer film (in those embodiments wherein a polymer film is deposited prior to deposition of the metal film), and metal film. In some preferred embodiments, the multilayer structure may be cleaned by heating the structure in a vacuum furnace in a reducing atmosphere. A chemical vapor deposition system may be used where only baking under high vacuum is performed. In preferred embodiments, the reducing atmosphere comprises hydrogen gas or other reducing gas. An inert carrier gas may be used, such as argon or helium. In preferred embodiments, the temperature during exposure to the reducing atmosphere is preferably between about 800° C. and about 1200° C., such as about 1000° C. The pressure is preferably sub-atmospheric, such as less than about 100 Pa (less than 1 Torr), preferably less than about 1 Pa (less than 0.01 Torr), even more preferably less than about 0.1 Pa (less than 0.001 Torr), and even more preferably less than about 0.01 Pa (less than 0.0001 Torr). The cleaning anneal may adjust the grain size of the metal film, e.g., increase the grain size at elevated temperatures.

In embodiments wherein the multilayer structure comprises the semiconductor substrate, optional surface dielectric layer, the polymer film, and the metal film comprising a metal that has high carbon solubility, the multilayer structure undergoes a heating and cooling cycle to bring about carbon absorption via in-diffusion into the metal film during heating, followed by carbon segregation and precipitation as graphene during cooling. In some embodiments, after sufficient carbon has in-diffused into the metal film from the carbon-containing self-assembled monolayer, the carbon-rich polymer, the carbon-containing gas or any combination thereof, according to the method of the present invention, a layer or multi-layer of graphene is precipitated between the front semiconductor substrate surface and the back metal film surface. In some embodiments, carbon atoms precipitate into a layer or multi-layer of graphene by optionally forming a temperature gradient profile in the semiconductor substrate having the metal film thereon. The temperature gradient profile is achieved by cooling the front and back surfaces of the multilayer substrate. Such cooling creates a temperature gradient in which the front metal film surface and the back metal film surface are less than the temperature near a central plane within the bulk metal region. In some embodiments, carbon atoms precipitate into a layer or multi-layer of graphene by rapidly cooling the multilayer structure.

Cooling the multilayer structure lowers the solubility of carbon within the bulk region of the metal film, which forces the carbon to segregate from the metal film and precipitation of graphene between the front surface of the semiconductor substrate and the back surface of the metal film. Accordingly, the method of the present invention is useful for preparing a multilayer article comprising the semiconductor substrate, which is optionally modified with a dielectric layer on the front surface thereof, a layer of graphene in contact with the front surface of the semiconductor substrate; and a metal film in contact with the layer of graphene.

The temperature during carbon in-diffusion may range from about 500° C. to about 1000° C., such as from about 700° C. to about 1000° C., such as from about 800° C. for iron or about 1000° C. for nickel. After the metal absorbs a sufficient concentration of carbon, the multilayer structure is cooled to thereby segregate and precipitate graphene during cooling. The cooling rate is preferably controlled to a rate of about 5° C./second to about 50° C./second, such as about 10° C./second to about 30° C./second, for example about 10° C./second or about 30° C./second. The pressure of the chamber may vary from about 0.1 Pascals (about 1 mTorr) to about 70 Pascals (about 500 mTorr). The atmosphere is preferably a reducing atmosphere, which may comprise between about 70% and about 99% hydrogen, preferably about 95% hydrogen, balance inert gas.

In embodiments wherein the multilayer structure comprises the semiconductor substrate, optional surface dielectric layer, the carbon-rich polymer film, and the metal film comprising a metal that has low carbon solubility, the multilayer structure undergoes a heating and cooling cycle to bring about degradation of the carbon-containing polymer at elevated temperature, the degraded carbon forming graphene catalyzed by the surface of the metal film. The temperature to bring about degradation of the carbon-containing polymer may range from about from about 500° C. to about 1000° C., such as from 700° C. to about 1000° C. The multilayer structure is cooled at a cooling rate such as between about 5° C./second to about 50° C./second, such as about 10° C./second to about 30° C./second, for example about 10° C./second or about 30° C./second. The pressure of the chamber may vary from about 0.1 Pascals (about 1 mTorr) to about 70 Pascals (about 500 mTorr). The atmosphere is preferably a reducing atmosphere, which may comprise between about 70% and about 99% hydrogen, preferably about 95% hydrogen, balance inert gas.

According to some embodiments of the method of the present invention, the multilayer structure comprising the semiconductor substrate, optionally a dielectric layer, and the metal film may be exposed to a carbon-containing gas to thereby in-diffuse atomic carbon into the bulk region of the metal film. In some embodiments, a carbon-containing gas flow may be added to the reducing gas flow. The carbon-containing gas may be selected from among volatile hydrocarbons, for example, methane, ethane, ethylene, acetylene, propane, propylene, propyne, butanes, butylenes, butynes, and the like. The carbon-containing gas, e.g., methane, is a source of carbon that may precipitate into graphene according to the process of the present invention. The minimum temperature during carbon in-diffusion and absorption is generally at least about 500° C. The maximum temperature during carbon in-diffusion and absorption is generally no more than about 1100° C. In general, the temperature is preferably between about 700° C. and about 1000° C. In general, the pressure inside the reaction chamber during hydrogen gas/methane flow is between about 600 Pa (about 5 Torr) and about 8000 Pa (about 60 Torr), preferably between about 1300 Pa (about 10 Torr) and about 7000 Pa (about 50 Torr). The multilayer structure is cooled at a cooling rate such as between about 5° C./second to about 50° C./second, such as about 10° C./second to about 30° C./second, for example about 10° C./second or about 30° C./second.

Optionally, and preferably, after sufficient carbon has in-diffused into the bulk region of the metal film, the flow of gases is stopped and the multilayer is held at the temperature of in-diffusion for a sufficient duration to allow the carbon to distribute throughout the bulk region of the metal film. The proper duration for carbon in-diffusion to yield a product having the desired number of graphene layers may be determined by creating a calibration curve in which the number of layers of the segregated graphene in the final product is a function of the carbon in-diffusion duration. The calibration curve may be used to determine ideal carbon in-diffusion durations sufficient to yield a graphene layer or multiple graphene layers. The duration of equilibration after the flow of carbon-containing gas is stopped may range from about 5 seconds to about 3600 seconds, such as about 600 seconds to about 1800 seconds. In some embodiments, the duration of carbon in diffusion is very short, such as about 10 seconds. Thereafter, the multilayer structure is rapidly cooled, as described above.

In embodiments wherein the solubility of carbon in a metal is low or zero (e.g., Copper), the method of the present invention advantageously yields a monolayer of graphene. In embodiments wherein graphene formation depends upon solubilization of carbon into the metal film followed by segregation and precipitation of graphene (e.g., Nickel), the method of the present invention requires control of the amount of carbon absorbed and precipitated to control the number of graphene layers produced. In either embodiment, conditions can be controlled so that at least a layer of graphene precipitates between the front surface of the semiconductor substrate and the back surface of the metal film. With reference now to FIG. 1, a multilayer structure that results from the method of the present invention is depicted therein comprising a semiconductor substrate 10, graphene layer 20 in contact with the semiconductor substrate 10, and a metal film 30 in contact with the layer of graphene 20. In some embodiments, the method of the present invention enables deposition of a single mono-atomic layer of graphene between the front surface of the semiconductor substrate and the back surface of the metal film. In some embodiments, the method of the present invention enables deposition of a bi-layer of graphene between the front surface of the semiconductor substrate and the back surface of the metal film, each layer of the bi-layer comprising a layer of graphene of mono-atomic thickness. In some embodiments, the method of the present invention enables deposition of a multi-layer of graphene having three or more layers between the front surface of the semiconductor substrate and the back surface of the metal film, each layer of the mult-layer comprising a layer of graphene of mono-atomic thickness. A second layer, bi-layer, or multi-layer of graphene may precipitate at the front metal film surface. Current results to date have shown that nickel layers in particular are suitable for preparing multi-layer graphene films.

According to embodiments wherein a graphene layer precipitates upon the front metal film surface, this exterior layer or layers of graphene may be removed. In some embodiments, the exterior graphene layer or layers may be removed by etching, for example, wet etching, plasma etching, or oxidation in ozone/UV light. In preferred embodiments, the exterior layer or layers of graphene may be removed by oxygen plasma etching.

According to the next step of the present invention, the metal film is removed to thereby expose the graphene layer in contact with the front surface of the semiconductor substrate. The metal film may be removed by techniques known in the art adequate to dissolve the metal of the metal film, e.g., dissolution of nickel, copper, iron, or alloys thereof. In preferred embodiments, the metal film is contacted with an aqueous metal etchant. Metal etchants useful for removing the metal film include ferric chloride, iron (III) nitrate, aqua-regia, and nitric acid. Advantageously, these metal etchants will not remove graphene.

In some embodiments, upon removal of the metal film, a multilayer substrate is produced comprising a semiconductor substrate and a single layer of graphene of mono-atomic thickness. The graphene layer may be characterized to confirm the number of layers by techniques known in the art, for example, Raman spectroscopy.

In some embodiments, upon removal of the metal film, a multilayer substrate is produced comprising a semiconductor substrate and a bi-layer of graphene, each layer of the bi-layer of mono-atomic thickness.

The formation of graphene on an oxidized silicon wafer opens up many potential applications, including single molecule detection, ultrafast FETs, hydrogen visualization-template for TEM, and tunable spintronic devices. Furthermore, graphene exhibits high thermal conductivity (25 X silicon), high mechanical strength (strongest nanomaterial), high optical transparency (97%), carrier controlled interband/optical-transition and flexible structure. Graphene's high density of π-electrons from the $sp^2$ carbon atoms and carrier-confinement in an open crystallographic structure imparts it with the highest mobility measured to date. Further, the unique combination of its crystallographic and electronic structure, graphene exhibits several superior and atypical properties, including weakly-scattered ($\lambda_{scattering}$>300 nm), ballistic transport of its charge carriers at room temperature; gate-tunable band gap in bilayers; quantum Hall effect at room temperature; quantum interference; magneto-sensitive-transport; tunable optical transmissions; megahertz characteristic frequency; and a chemically and geometrically controllable band gap. Other applications include bio-electronic-devices, tunable spintronics, ultra-capacitors, and nano-mechanical devices. It is anticipated that the direct graphene formation on oxidized silicon will provide a unique graphene-structure on silicon-based platform for a wide variety of electronic and sensing applications.

The following non-limited example is provided to further illustrate the present invention.

EXAMPLE 1

An approximately 5 centimeter (two inch) diameter silicon dioxide layer having a thickness of 90 nanometers was formed on an n-type silicon substrate. The substrate was cleaned by using oxygen plasma (100 W, 600 mTorr, 2 min). A layer of PMMA was spin-coated (1% in acetone, 4000 rpm (as an example)) on the silica substrate. Then, a 500 nm thick metal layer was deposited on the PMMA layer in a metal evaporator system. In one embodiment, the metal layer comprised nickel. In a separate embodiment, the metal layer comprised copper. The metal-on-PMMA-on-silica-on-silicon substrate was put inside a CVD chamber. The sample was baked at 1000° C. for 30 min (as an example) to anneal the film. Finally, the temperature of the CVD was brought to 1000° C. and hydrogen gas was inflown at a pressure of 100 mTorr for 30 min. Finally, the sample was rapidly cooled at 10° C./second to room temperature. This produced graphene at the interface between metal and silica. Finally, the metal film was etched with iron (III) nitrate, rendering graphene on silica-on-silicon substrate.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A multilayer article comprising:
   a semiconductor substrate comprising two major, generally parallel surfaces, one of which is a front surface of a donor substrate and the other of which is a back surface of the donor substrate, a circumferential edge joining the front and back surfaces, and a central plane between the front and back surfaces;
   a layer of graphene in contact with the front surface of the semiconductor substrate; and
   a metal film in contact with the layer of graphene, the metal film comprising a front metal film surface, a back metal film surface, and a bulk metal region between the front and back metal film surfaces.

2. The multilayer article of claim 1 wherein the semiconductor substrate comprises a semiconductor wafer.

3. The multilayer article of claim 2 wherein the semiconductor wafer comprises a material selected from the group consisting of silicon, gallium arsenic, silicon carbide, silicon germanium, silicon nitride, silicon dioxide, germanium, and combinations thereof.

4. The multilayer article of claim 3 wherein the semiconductor wafer comprises a silicon wafer sliced from a single crystal silicon ingot grown by the Czochralski method.

5. The multilayer article of claim 4 wherein the front surface of the semiconductor substrate comprises a dielectric layer.

6. The multilayer article of claim 4 wherein the front surface of the semiconductor substrate comprises a silicon oxide layer.

7. The multilayer article of claim 6 wherein the silicon oxide layer is between about 50 nanometers and about 1000 nanometers thick.

8. The multilayer article of claim 7 wherein the silicon oxide layer is between about 90 nanometers and about 300 nanometers thick.

9. The multilayer article of claim 1 wherein the layer of graphene in contact with the front surface of the semiconductor substrate comprises a single mono-atomic graphene layer.

10. The multilayer article of claim 1 wherein the layer of graphene in contact with the front surface of the semiconductor substrate comprises a graphene bi-layer.

11. The multilayer article of claim 1 wherein the metal film is between about 50 nanometers and about 20 micrometers thick.

12. The multilayer article of claim 1 wherein the metal film is between about 50 nanometers and about 10 micrometers thick.

13. The multilayer article of claim 1 further comprising a layer of graphene in contact with the front metal film surface.

* * * * *